(12) United States Patent
Sirringhaus et al.

(10) Patent No.: US 8,758,983 B2
(45) Date of Patent: Jun. 24, 2014

(54) METHOD OF PATTERNING AN ELECTRONIC OF PHOTONIC MATERIAL

(75) Inventors: Henning Sirringhaus, Cambridge (GB); Jui-Fen Chang, Taoyuan (TW)

(73) Assignee: Cambridge Enterprise Limited, Cambridge, Cambridgeshire (GB)

( * ) Notice: Subject to any disclaimer, the term of this patent is extended or adjusted under 35 U.S.C. 154(b) by 406 days.

(21) Appl. No.: 13/126,710

(22) PCT Filed: Oct. 29, 2009

(86) PCT No.: PCT/GB2009/051456
§ 371 (c)(1),
(2), (4) Date: May 24, 2011

(87) PCT Pub. No.: WO2010/061206
PCT Pub. Date: Jun. 3, 2010

(65) Prior Publication Data
US 2011/0232954 A1 Sep. 29, 2011

(30) Foreign Application Priority Data

Nov. 3, 2008 (GB) .................................. 0820068.5
Nov. 7, 2008 (GB) .................................. 0820396.0

(51) Int. Cl.
*G03F 7/26* (2006.01)

(52) U.S. Cl.
USPC ......................................................... 430/311

(58) Field of Classification Search
USPC ......................................................... 430/311
See application file for complete search history.

(56) References Cited

U.S. PATENT DOCUMENTS

| | | |
|---|---|---|
| 6,966,997 B1 | 11/2005 | Inganas et al. |
| 2004/0171255 A1 | 9/2004 | Roth |
| 2004/0265492 A1 | 12/2004 | Free |
| 2005/0153107 A1 | 7/2005 | Iijima |
| 2007/0184365 A1 | 8/2007 | Kim |
| 2008/0050662 A1* | 2/2008 | Kobayashi et al. ............... 430/7 |

FOREIGN PATENT DOCUMENTS

| | | |
|---|---|---|
| DE | 3924716 | 2/1990 |
| GB | 1197398 | 7/1990 |
| JP | 2002-137229 | 5/2002 |
| WO | WO 2007/128965 | 11/2007 |

OTHER PUBLICATIONS

Chabinyc et al. "Lamination Method for the Study of Interfaces in Polymeric Thin Film Transistors". Web. Oct. 9, 2004. 13928-13929. vol. 126. J. Am. Chem Soc.
Chang J-F et al: "Patterning of solution-processed semiconduction polymers in gigh-mobility thin-film transistors by physical delamination" Advanced Materials Jun. 26, 2009 Wiley.
Chen et al. "Ploymer Transfer Printing: Application to Layer Coating, Pattern Definition, and Diode Dark Current Blocking". Adv. Mater. 2008,20,1679-1683.

* cited by examiner

*Primary Examiner* — Kathleen Duda
(74) *Attorney, Agent, or Firm* — Hamilton DeSanctis & Cha (57) ABSTRACT

The present invention provides a method of patterning an electronic or photonic material on a substrate comprising: forming a film of said electronic or photonic material on said substrate; and using an adhesive to selectively remove regions of said electronic or photonic material from said film, thereby leaving on said substrate said patterned electronic or photonic material.

23 Claims, 6 Drawing Sheets

METHOD OF PATTERNING AN ELECTRONIC OF PHOTONIC MATERIAL

CROSS REFERENCE TO RELATED APPLICATION

This application is the United States national stage filing of PCT/GB2009/051456 entitled "Method of Patterning an Electronic of Photonic Material" and filed Oct. 29, 2009; which claims priority to Great Britain Patent Application GB0820068.5 filed Nov. 3, 2008, and Great Britain Patent Application GB0820396.0 filed Nov. 7, 2008. All of the aforementioned applications are incorporated herein by reference for all purposes.

BACKGROUND OF THE INVENTION

This invention relates to methods of patterning electronic and photonic materials, in particular those deposited using solution-deposition techniques, such as semiconducting polymers, and to structures and devices fabricated using these methods.

In the past decade solution-processed semi conducting polymers have become an attractive class of materials for plastic electronics because they are easily processible for low-cost, large-area devices. There has been tremendous progress on materials design, device architecture and fabrication, and understanding of the charge transport mechanism in these materials. Particularly, the development of semi crystalline semi conducting polymers such as poly(3-hexylthiophene) (P3HT), poly[5,5'-bis(3-alkyl-2-thienyl)-2,2'-bithiophene)] (PQT), and poly(2,5-bis(3-alkylthiophen-2-yl) thieno[3,2-blthiophene) (PBTTT) for solution-processed thin film transistors (TFTs) has enabled achieving mobilities of 0.01-1 cm2 Ns approaching those of amorphous silicon or small molecule transistors. The high mobilities in these semi crystalline semi conducting polymers are primarily attributed to the formation of preferentially in-plane oriented n-n stacking that leads to efficient in-plane charge transport. The highly crystalline structures and high bulk conductivity in these polymers, however, leads to non-negligible leakage currents through the bulk of the film which result in low ONOFF current ratios of the transistors if the semi conducting film is un-patterned. It also causes undesirable crosstalk in realization of integrated circuits. It is thus necessary to develop techniques for patterning semi conducting polymer thin films to prevent the formation of conductive pathways between individual devices.

Various techniques have been developed to pattern polymers such as direct writing by scanning probe microscopy, ink-jet printing, nanoimprinting, microcontact printing, dry-etching process by laser ablation, and photolithography. These techniques have great advantages in achieving relatively high resolution (microns to 35 nanometers) but it can be challenging to avoid compromises and trade-offs between the processing requirements to achieve best patterning and the processing conditions to achieve optimum device performance. Problems often include polymer degradation during patterning induced by, for example, photoirradiation, usage of chemicals or solvents incompatible with polymers, or the need to perform the patterning in ambient environment. On the other hand, a few approaches have been developed that avoid materials degradation and enable patterning of "sensitive" polymer semi conductors which are prone to oxidation in air and/or whose performance is very sensitive to polymer microstructure, substrate roughness, film deposition conditions, solvent exposure etc. These include patterning involving selective dewetting, phase separation, transfer printing, and using innovative materials which are compatible with polymer semiconductors in conventional lithographic patterning. In particular, transfer printing has been used to pattern small molecule and polymer semiconductors for device applications. This approach mainly utilizes a hard master or a poly(dimethylsiloxane) (PDMS) mold to pick up a semi conducting polymer film from a first substrate and transfer it onto another substrate, either as a continuous film or involving patterning. In the latter approach patterning is achieved by picking up the polymer film selectively from the first substrate by using a suitably patterned mold with its surface modified by glycerol. The benefits of this transfer printing approach are high resolution and compatibility with multi-layer patterning. However, the specific surface properties of the transfer mold and substrates, for example, the glycerol modification required for picking up and transferring the polymer film, might influence the surface/interface quality of the patterned semi conducting polymer and impact device performance adversely if the polymer semiconductor is "sensitive".

Hence there is a need for new, simple patterning techniques that enable high resolution patterning of semi conducting polymers that do no impact adversely on the final device. It has now been surprisingly found that patterning may be based on selective physical delamination instead of chemical patterning or etching processes. The delamination processes can be easily integrated into device fabrication under inert atmosphere and can avoid degradation of semi conducting polymers induced by oxygen exposure and chemicals. The spatial resolution of the technique may be defined by a lithographic step performed prior to polymer deposition.

BRIEF DESCRIPTION OF THE DRAWINGS

The method will now be described by the following non-limiting examples and Figures wherein:

FIG. 2 shows (a) an optical image of patterned PBTTT strips with 2 pm line width separated by 10 pm over a large surface area, inset shows a clear image performed by tapping-mode atomic force microscopy, and (b) three-dimensional surface morphology view for the inset in (a);

FIG. 3 shows (a) a schematic diagram of patterned PBTTT top-gate TFTs; (b) Image of the patterned PBTTT on top of source-drain electrodes; (c) Comparison of transfer characteristics at Vds=-5 V of the patterned and un-patterned PBTTT top-gate TFTs with -500 nm thick PMMA dielectric. The channel length and width are 40 pm and 1000 pm, respectively. The inset shows the comparison with a -500 nm thick PS dielectric; (d) The same comparison as (c) for the channel length of 2 pm. The inset 20 shows the linear mobilities of the patterned and un-patterned devices with PMMA dielectric as a function of channel length from 40 pm to 2 pm. Each data point and error bar was extracted from at least four devices;

FIG. 5 shows (a) an optical image of the PBTTT film spin-coated on the patterned polyimide (PI) film; (b) Optical image of the patterned PBTTT film in the OTS-treated area on the Si/SiO2 substrate after peel-off of the PI. Inset shows a tappingmode atomic force microscopy image of the edge of the patterned PBTTT film; (c) Three-dimensional surface morphology view for the inset in (b)

BRIEF SUMMARY OF THE INVENTION

This invention relates to methods of patterning electronic and photonic materials, in particular those deposited using solution-deposition techniques, such as semiconducting polymers, and to structures and devices fabricated using these methods.

Thus viewed from a first aspect the invention provides a method of patterning an electronic or photonic material on a substrate comprising: forming a film of said electronic or photonic material on said substrate; and using an adhesive to selectively remove regions of said electronic or photonic material from said film, thereby leaving on said substrate said patterned electronic or photonic material.

In a preferred embodiment of the method the surface of the substrate is treated to provide said surface with a pattern defining where said electronic or photonic material is to be present prior to formation of the film of electronic or photonic material. Viewed from a further aspect the invention provides the use of an adhesive in the preparation of a patterned electronic or photonic material on a substrate, wherein said adhesive is used to selectively remove regions of said electronic or photonic material from a film thereof, thereby leaving on said substrate said patterned electronic or photonic material.

Viewed from a still further aspect the invention provides a patterned electronic or photonic material on a substrate obtainable by a method as hereinbefore described. Viewed from another aspect the invention provides an electronic or photonic device comprising a patterned electronic or photonic material on a substrate as hereinbefore described.

In a preferred embodiment the device is a transistor comprising said patterned electronic or photonic material as an active semi conducting layer. Viewed from another aspect the invention provides an electronic or photonic device comprising: a substrate; and at least one patterned layer of electronic or photonic material (e.g. an organic semi conductor); wherein the thickness of said layer of electronic or photonic material at a distance 2 microns away from the edge of the pattern is within 10% of the average thickness of the layer of electronic or photonic material.

Viewed from another aspect the invention provides a method of making an electronic or photonic device on a substrate comprising: preparing a patterned electronic or photonic material on a substrate as hereinbefore described; and using said substrate bearing said pattern in the manufacture of a device.

Alternatively viewed the invention provides a method of fabricating an electronic or photonic device on a substrate using solution or vacuum deposition of an electronic or photonic material, the method comprising: providing said substrate; treating a surface of said substrate to provide said substrate with a pattern defining where said electronic or photonic material is to be present on said fabricated device; depositing said electronic or photonic material from solution or vacuum over said pattern on said substrate such that the deposited material overlaps the edges of said pattern and has regions extending beyond said edges of said pattern; applying a carrier bearing an adhesive over said deposited electronic or photonic material on said substrate; removing said adhesive bearing carrier together with said regions of said deposited material extending beyond said edges of said pattern to leave said deposited material in situ in said pattern; and using said substrate bearing said pattern of deposited material to fabricate said electronic or photonic device.

As used herein the term substrate is used to refer to the base on which the patterned electronic or photonic material is formed. The electronic or photonic material may or may not be formed directly on the substrate (i.e. one or more intermediate layers may be present). Nevertheless the substrate forms the platform of the overall structure. The substrates used in the methods of the invention may be any conventional substrate used in the preparation of electronic or photonic materials. Preferred substrates are smooth, i.e. have substantially no surface roughness. Representative examples of substrates include plastics (e.g. polyethylene terephthalate or polyethylene naphthalene) metals, quartz, glass and Si/SiO2. The substrate may also be coated with a metal oxide. Preferred substrates are glass and Si/SiO2. As stated above, in preferred methods the surface of the substrate is initially treated to provide said surface with a pattern defining where said electronic or photonic material is to be present prior to formation of the film of electronic or photonic material.

As used herein the term electronic or photonic material is used to refer to any material having electron or photon conducting properties respectively. Preferred materials for use in the methods are electronic materials. Preferred electronic or photonic materials for use in the methods of the invention are organic non-polymeric (e.g. molecular) or polymeric semi conductors, conducting polymers, polymer dielectrics or nanoparticulate material, such as nanoparticles, nanowires, or nanotubes. Preferred materials for use in the methods of 15 the invention are those electronic or photonic materials in which there is no 3-dimensional network of strong covalent or ionic bonds in the films, but merely weak non-covalent or ionic bonds between individual molecules/particles, such that the film can be torn when the adhesive is removed.

A preferred electronic material is an organic semi-conductor, i.e, a carbon containing material that has semi conductor properties. Organic semi conductors for use in the present invention may be polymeric or non-polymeric. Preferred polymeric and non-polymeric semi conductors are conjugated. Representative examples of nonpolymeric semi conductors that may be used in the present invention include vacuum-sublimed pentacene and triisopropylsilyl-substituted pentacene (TIPS-pentacene).

Preferred polymeric semi conductors are semi crystalline (e.g. have a crystallinity of at least 60% as determined by differential scanning calorimtery). Representative examples of polymeric semi-conductors that may be used in the present invention include polyfluorenes, polythiophenes, polythienylene-vinylenes and polyphenylene-vinylenes. Polymeric organic semi-conductors are generally preferred (e.g, poly(3-hexylthiophene) (P3HT), poly[5,5'-bis(3-alkyl-2-thienyl)-2,2'-bithiophene)] (PQT), and poly(2,5-bis(3-alkylthiophen-2-yl)thieno[3,2-b]thiophene) (PBTTT)). A particularly preferred organic semi-conductor is poly(2,5-bis(3-tetradecylthiophen-2-yl)thieno[3,2-blthiophene) (PBTTT-C14).

In some embodiments of the method, the film of electronic or photonic material fills the pattern, overlaps the edges of the pattern formed on the substrate and has regions extending beyond said edges of said pattern. This ensures that the pattern is filled with electronic or photonic material and minimises the amount of amount of material to be removed with adhesive. In other preferred embodiments, the film of electronic or photonic material is continuous.

As used herein the term "continuous film" is used to refer to a film that does not have any interruptions or breaks therein, The continuous film may or may not have a uniform thickness. The continuous film may planar or non-planar. A change in thickness and/or plane does not constitute an interruption or break of the film, i.e. it is still considered to be continuous. When the film is continuous the pattern on the substrate may be more reliably filled with electronic or photonic material and better definition produced in the resulting patterned material.

In preferred methods, the film of electronic or photonic material is formed by solution deposition. The adhesive used in preferred methods is on a carrier. Preferably the carrier has a non-adhesive side. This enables the adhesive to adhere to the material underneath it but at the same time to be easily handled.

As used herein the term adhesion is used to refer to the strength with which two surfaces are held together. Adhesion may be measured quantitatively by measuring interfacial toughness (~/m~).

In preferred methods the adhesive is in the form of a laminate, e.g. a strip or sheet of material. Thus in preferred methods of patterning, the adhesive is laminated onto an underlying material. More preferably the adhesive is on the form of a tape, particularly a tape that can conform to the shape of the material to which it is applied. Pressure may be applied to the adhesive to improve its adhesion. Adhesives in the form of tapes are preferred as they can easily be removed by peeling. Commercially available adhesive tape, such as 3M Scotch tape, may be used. The removal of the adhesive, preferably by peeling, is the key step in the methods herein described as it enables selective removal of regions of electronic or photonic material from the film, thereby leaving behind on the substrate a patterned electronic or photonic material. If necessary, the use of adhesive may be applied more than once (e.g. twice, three or a plurality of times) to ensure the desired selective removal of electronic or photonic material is achieved.

In a first embodiment of the methods herein described the substrate on which the patterned electronic or photonic material is to be formed preferably has a high surface energy. In other words, the surface of the substrate is preferably hydrophilic. A preferred substrate for use in this embodiment is glass. The surface of the substrate (e.g. glass) is preferably treated to provide it with a pattern defining where the electronic or photonic material is to be present. Patterning may be achieved in any conventional manner. Preferably, however, the surface of the substrate is patterned such that it has a varying interfacial toughness with the surface of the electronic or photonic material once it is deposited. Still more preferably the surface of the substrate is modified to define areas that have different, preferably higher and lower, surface energies. The areas of higher surface energy defined in this process should correspond to the pattern of electronic or photonic material that is ultimately desired.

Modification is preferably achieved by depositing on the surface of the substrate a surface energy modification layer and patterning the layer, e.g., by conventional photolithography. The surface energy modification layer preferably comprises a hydrophobic compound, e.g, an organosilane. Organosilanes are preferred as they 25 can self-assemble into a monolayer. Preferred modification layers have a uniform thickness. Representative examples of organosilanes that can be used for modification of the substrate include alkyltrichlorosilanes (e.g. octyltrichlorosilane (OTS)), perfluorotrichlorosilanes and hexamethyldisilazane (HMDS). Preferred organosilanes are alkyltrichlorosilanes, e.g. OTS.

Organosilanes are generally more hydrophobic than substrates (e.g. glass), therefore those areas on which organosilane is deposited have a lower surface energy than those areas in which the glass is bare. The areas of bare glass should therefore correspond to the pattern of organic semi-conductor that is sought.

The surface energy modification layer (e.g. organosilane) may be applied to the substrate using any conventional method. For example, the modification layer (e.g., organosilabe) may be deposited on the substrate by transfer printing. In a preferred method, however, the surface energy modification layer (e.g. organosilane) is deposited (e.g. by spin coating) on the substrate and then patterned by photolithography. Thus a layer of organosilane is deposited (e.g, by spin coating) on the substrate followed by a layer of photoresist then photolithography is carried out to selectively remove regions of the resist. The modification layer (e.g. organosilane) in those areas where photoresist is removed can then be removed by, e.g. O2 plasma etching, to expose the substrate (e.g, glass). Finally the photoresist can be stripped off to yield a surface having areas of higher and lower surface energy. The areas of bare substrate (e.g., glass) have higher surface energy than those areas covered with a surface energy modification layer (e.g, organosilane).

Where present the thickness of the layer of surface energy modification layer (e.g. organosilane) is preferably in the range 0.1-10 nm, more preferably 0.5-5 nm, e.g., about 1 nm when OTS is used and <1 nm when HMDS is used. As hereinbefore described, a film (e.g. a continuous film) of electronic or photonic material is then formed on the substrate. The film may be formed by any conventional technique, e.g., spin coating. The electronic or photonic material film will form on top of the surface energy modification layer (e.g. organsilane) where it is present and directly on the substrate where modification layer is absent. Thus the film is likely to have a variable thickness. As the surface energy modification layer is very thin, however, the film of electronic or photonic material is relatively uniform.

The maximum thickness of the film of electronic or photonic material is preferably in the range 10-1000 nm, more preferably 100-500 nm, e.g. 50-250 nm. Preferably the thickness of the film of electronic or photonic material is less than 300 nm, still more preferably less than 200 nm.

A preferred method comprises the further step of depositing a sacrificial layer on the electronic or photonic material film. As used herein the term sacrificial layer is used to refer to a layer of material that is used in the preparation of a patterned electronic or photonic material but which is not a part of the patterned material per se. The sacrificial layer is preferably a material that has a stronger adhesion to the electronic or photonic material than the adhesion of the electronic or photonic material to those areas of the substrate modified to have lower surface energy (e.g, those modified with a hydrophobic compound such as an organosilane). Still more preferably the sacrificial material is a material that has a weaker adhesion to the electronic or photonic material than the adhesion of the electronic or photonic material to those areas of the substrate having a higher surface energy (e.g. bare substrate such as glass). Preferably the sacrificial layer does not form any covalent bonds to the film of electronic or photonic material. Preferably the sacrificial layer and the film of electronic or photonic material are orthogonal. This may be achieved by depositing the sacrificial layer from a solvent that does not dissolve or swell the electronic or photonic material. This reduces the risk of disruption to the underlying layer. In other embodiments, however, it may be desirable to slightly dissolve and/or swell the underlying layer of electronic or photonic material. This may be the case, for example, if it necessary to increase the adhesion between the sacrificial layer and the electronic or photonic material. The skilled man will readily be able to choose solvents that are orthogonal or non-orthogonal as required.

The skilled man in the art will be able to readily determine suitable materials for use as sacrificial layers. Generally polymers are preferred, although non-polymer compounds may also be used. Representative examples of materials that may be used for the sacrificial layer include poly(methylmethacrylate) (PMMA), polystyrene (PS) and polyvinylphenol (PVP). PMMA is a particularly useful sacrificial layer, especially when the electronic or photonic material is PBTTT.

The sacrificial layer may be deposited on the continuous film of electronic or photonic material using any conventional technique known in the art. Preferably, however, the sacrificial layer is deposited using spin coating. The thickness of the sacrificial layer is preferably greater than 0.5 µm, more preferably greater than 1 µm, e.g. in the range 1-10 µm. In a preferred method, an adhesive is brought into contact with (e.g. deposited on) the sacrificial layer. Preferably the adhesive is laminated on the sacrificial layer.

Still more preferably the adhesive is in the form of a tape that can be laminated on the sacrificial layer. Pressure may optionally be applied to the laminated adhesive. Preferably the adhesive is removed by peeling. Thus a preferred method of the invention comprises: providing a patterned substrate having areas of higher and lower surface energies and having deposited thereon (i) a continuous film of electronic or photonic material and (ii) a sacrificial layer; bringing an adhesive into contact with said sacrificial layer (e.g., depositing an adhesive on said sacrificial layer); and peeling off said adhesive to selectively remove regions of said electronic or photonic material from said film. The interface between the adhesive and the sacrificial layer is tough, thus when the adhesive is peeled it will not delaminate from the sacrificial layer. Rather the adhesive will remain attached to the sacrificial layer and it is removed along with the adhesive. Additionally electronic or photonic material is removed from those areas where it is present on surface areas having lower interface toughness (usually the areas with lower surface energy, e.g. those areas covered with hydrophobic compound) since the adhesion between them is less than the adhesion between the electronic or photonic material and the sacrificial layer. In contrast, electronic or photonic material is not removed from those areas where it is present on the surface areas having higher interface toughness (usually the areas of higher surface energy, e.g., those areas of bare substrate) since the adhesion between them is higher than the adhesion between the electronic or photonic material and the sacrificial layer. The difference in the adhesion between the various materials (e.g. substrate, surface energy modification layer, electronic or photonic material, sacrificial layer) therefore enables the adhesive to selectively remove regions of the electronic or photonic material. Those regions of electronic or photonic material remaining on the substrate form the patterned electronic or photonic material. Thus a preferred method of the invention comprises: treating the surface of said substrate to define areas having higher and lower surface energies; forming a film of said electronic or photonic material on said substrate; depositing a sacrificial layer on said film; bringing an adhesive into contact with said sacrificial layer (e.g. depositing an adhesive on said sacrificial layer); and peeling off said adhesive to selectively remove regions of said electronic or photonic material from said film.

In a particularly preferred method, the adhesion between said electronic or photonic material and said regions of substrate having higher surface energy is stronger than the adhesion between said electronic or photonic material and the sacrificial layer and adhesion between said electronic or photonic material and the sacrificial layer is stronger than the adhesion between said electronic or photonic material and said regions of substrate having lower surface energy.

In another embodiment of the methods herein described, any substrate may be used, e.g., glass, Si/SiO2. Indeed an advantage of this related method is that the surface of the substrate is not critical. As in the first embodiment hereinbefore described, the surface of the substrate is preferably treated to provide the surface with a pattern defining where the electronic or photonic material is to be present. Preferably the pattern is a topographical profile comprising protrusions and recesses. The recesses correspond to the pattern of electronic or photonic material that is sought. In preferred methods, the surface of the substrate is initially provided with a surface energy modification layer as hereinbefore described in relation to the first embodiment. A preferred organosilane for use in this method is hexamethyldisilylazane (HMDS). Again, as described above in relation to the first method, the surface energy modification layer may be deposited by any conventional method, e.g. by spin coating. The thickness of the layer (e.g., organosilane) is preferably in the range 0.1-10 nm, more preferably in the range 0.2-5 nm, e.g. 0.5-2 nm. Preferably the thickness of the layer is less than 1 nm. A layer of sacrificial material is preferably deposited on the surface of the substrate, e.g., on the surface of the surface energy modification layer when present.

As with the first embodiment, the skilled man will readily determine suitable materials for use as the sacrificial layer. Preferred materials are those that can be patterned. Further preferred materials are insoluble in organic solvents. Yet further preferred materials can be delaminated from the surface energy modification layer. A preferred material is polyimide. The layer of sacrificial material is preferably at least 3 times, more preferably 10 times, e.g. 10 times thicker than the thickness of the film of electronic or photonic material. The sacrificial layer may have a thickness of 100-2000 nm, more preferably 200-1000 nm thick, e.g. 300-750 nm thick.

Preferably treatment of the surface of the substrate to provide it with a pattern is carried out after the sacrificial material has been deposited. Patterning may be achieved by any conventional method, but is preferably carried using photolithography. Thus following deposition of the sacrificial layer, a layer of photoresist is deposited (e.g., by spin coating) and then photolithography is carried out to selectively remove regions of the resist. When present, the surface energy modification layer (e.g, organosilane) in those areas where photoresist is removed can then be removed by, e.g. O2 plasma etching to reveal the substrate. The photoresist can then be stripped off. The resulting form has a topographical profile comprising protrusions and recesses.

As mentioned above an advantage of this embodiment is that the electronic or photonic material can be deposited on a wide range of surfaces. Thus in preferred methods, a material is deposited in those areas of substrate exposed by the patterning process. For instance, an organosilane as listed above as a surface energy modification layer may be deposited therein, e.g. OTS. Deposition may be achieved by spin coating.

In preferred methods, a film of electronic or photonic material is formed on the sacrificial layer. Although the sacrificial layer has a topographical profile comprising protrusions and recesses the electronic or photonic material is preferably deposited continuously across the undulating profile (i.e. on protrusions and in recesses) to ensure that the desired pattern is properly filled. Thus in this embodiment the film is usually non planar. The thickness of the film of electronic or photonic material is preferably in the range 50-500 nm, more preferably 100-300 nm, e.g. 150-250 nm. As mentioned above, the adhesive is preferably a laminate. This enables the adhesive to be laminated to the protrusions and also to form a bridge across the recesses. Particularly preferably the adhesive is in the form of a tape that can be laminated on the protrusions. Tension may be applied to the tape as necessary to prevent it contacting the electronic or photonic material present in the recesses.

The adhesive is preferably brought into contact with (e.g. deposited on) the sacrificial layer, preferably at the edges of the protrusions. Thus when adhesive is contacted with (e.g., deposited on) the protrusions, it is usually also contacted with (e.g., deposited on) electronic or photonic material because its film at least overlaps the edges of the pattern. The adhesive is therefore preferably partially contacted with (e.g., deposited on) the sacrificial layer and partially contacted with (e.g. deposited on) electronic or photonic material that is present on said layer. Hence removal of the adhesive may involve tearing the electronic or photonic material at the edges of the pattern. Surprisingly this technique still yields patterns having well defined patterns.

Preferably the adhesive is removed by peeling. Thus a preferred method of the invention comprises: providing a patterned substrate having deposited thereon (i) a sacrificial layer in the form of a topographical profile comprising protrusions and recesses and (ii) a film of electronic or photonic material; bringing an adhesive into contact with said protrusions (e.g., depositing an adhesive on said protrusions); and peeling off said adhesive to selectively remove regions of electronic or photonic material from said film.

The adhesive forms a strong bond to the sacrificial layer and to the electronic or photonic material to which it is attached and will not delaminate therefrom, Rather the adhesive will remain attached to these materials and they are removed along with the adhesive. Removing the adhesive may therefore include tearing through a thickness of the electronic or photonic material at the edges of the pattern. The electronic or photonic material that remains on the substrate is that which was present in the recesses. This is not removed as it is not contacted by adhesive.

Thus a preferred method comprises: depositing on the surface of a substrate a sacrificial layer and treating said layer to define a topographical profile; forming a film of said electronic or photonic material on said profile; bringing an adhesive into contact with said protrusions (e.g, depositing an adhesive on said protrusions); and peeling off said adhesive to selectively remove regions of said electronic or photonic material from said film.

It will be recognized that the above described approaches employ selective physical delamination of the deposited electronic or photonic material, which provides the advantage of leaving the deposited material in situ, reducing any disruption to the physical microstructure of the layer of this material, and hence the risk of damaging its electrical properties, in particular mobility, and 1 or optical properties, for example transparency.

The above-described methods also provide the advantage of providing patterns with extremely well defined edges. The corners formed by the top and sides of the electronic or photonic material forming the pattern typically have an angle of close to 90' (e.g. 85-90'). This can be achieved because the methods hereinbefore described yield patterns wherein the thickness of the electronic or photonic material is surprisingly uniform all the way to the edges. In preferred devices the thickness of the layer of electronic or photonic material at a distance 2 microns away from the edge of the pattern is within 10%, more preferably within 5%, still more preferably within 3% of the average thickness of the layer of electronic or photonic material.

The skilled person will also understand that the above-described techniques may be employed to fabricate a photonic device such as a wave-guide, switch, interferometer, non-linear optical device. However some particularly useful for applications of the method are in fabricating molecular electronic devices, in which the electronic/photonic material comprises a semi-conducting material, advantageously in embodiments of the methods a polymeric semi-conducting material. Thus the substrate may be provided with one or more electrodes and, optionally, over these may be deposited one or more layers of energy level matching material to match an energy level of the electrodes (metal) to an energy level of the semi-conducting material employed. Thus, for example, the electronic device may comprise a solution processed bottom-gate or top-gate field effect transistor (FET), or diode (including light emitting and photodiodes (or other solutions-deposited semi-conducting electronic device). One particular advantage of embodiments of the method is the high charge carrier-mobilities which may be retained after deposition of the semi-conducting material, because the semi-conducting material is left in situ on the substrate. Thus, for example, the deposited electronic/photonic material may be subjected to one or more further processing steps to, for example, modify the microstructure of the layer to improve mobility/transparency, such as an annealing step. In embodiments such one or more further steps may be performed under an inert atmosphere to inhibit This summary provides only a general outline of some embodiments of the invention. Many other objects, features, advantages and other embodiments of the invention will become more fully apparent from the following detailed description, the appended claims and the accompanying drawings.

DETAILED DESCRIPTION

This invention relates to methods of patterning electronic and photonic materials, in particular those deposited using solution-deposition techniques, such as semiconducting polymers, and to structures and devices fabricated using these methods.

Example 1

Figure 1:
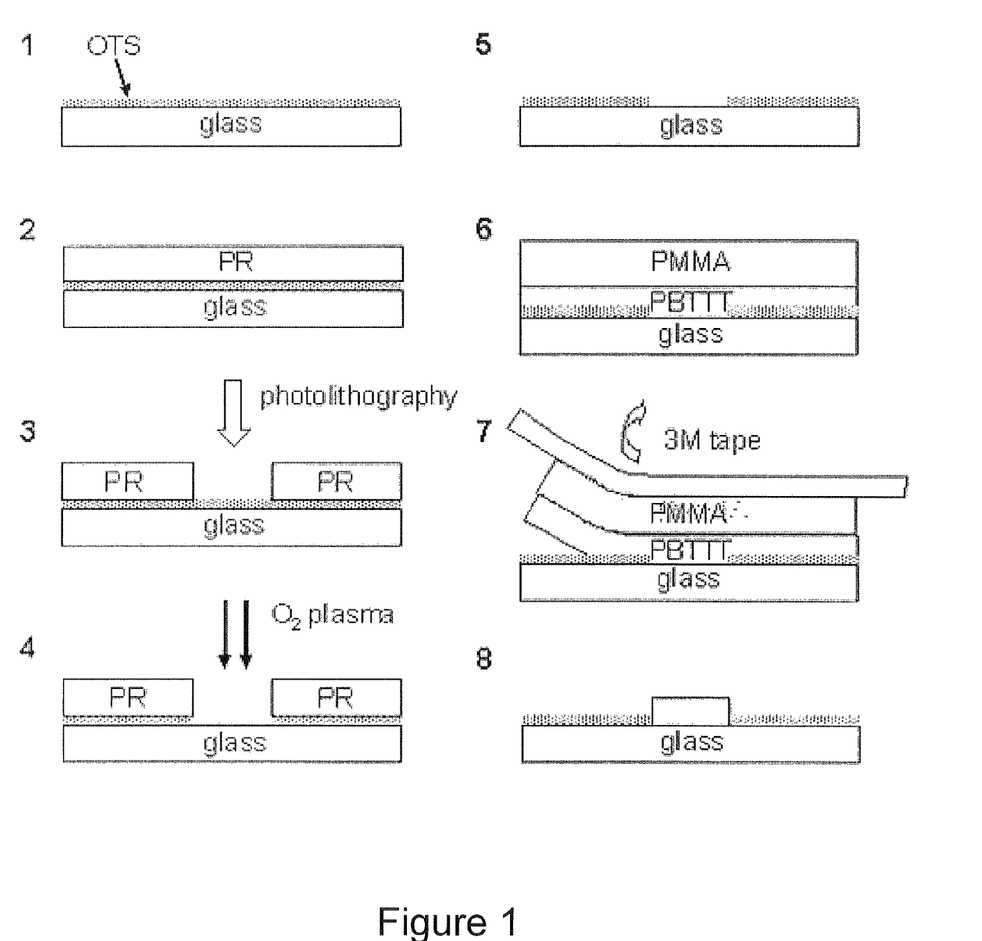
FIG. 1 shows a schematic process flow for patterning PBTTT polymer films by using a PMMA dielectric film as a sacrificial layer and 3M Scotch tape to selectively delaminate the PBTTTIPMMA films from OTS covered, hydrophobic areas of the substrate that were prepatterned using a PR pattern defined by photolithography.

The process of a first embodiment as illustrated in FIG. 1 was followed. Octyltrichlorosilane (OTS) was deposited as a self-assembled monolayer on a bare glass substrate. The OTS layer was then patterned with conventional photolithography to create a lateral contrast in surface energy. The OTS on the unprotected areas was removed with O2 plasma etching and the area became hydrophilic, whereas the areas covered with photoresist remained hydrophobic. After stripping the photoresist, a PBTTT thin film was spun, followed by spin-coating a poly(methylmethacrylate) (PMMA) film as a sacrificial layer. Finally, 3M Scotch tape was used to delaminate the PMMA films. Because the adhesion between PBTTT and PMMA films is stronger than the adhesion of PBTTT to the OTS-treated areas but weaker than the adhesion of PBTTT to the hydrophilic areas, the delamination of the PMMA film only peeled off the PBTTT film from the hydrophobic areas but left the PBTTT film only on the hydrophilic areas.

Figure 2A:
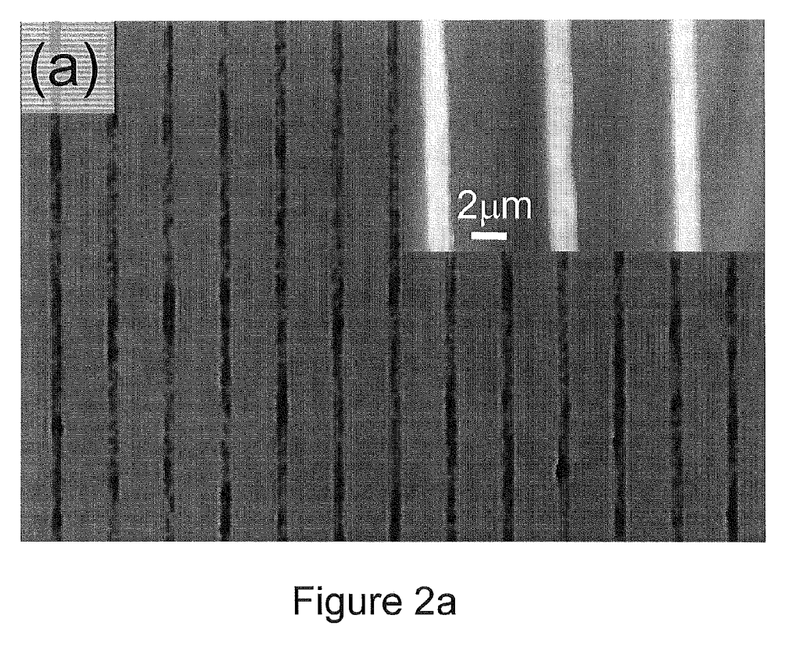
Figure 2B:
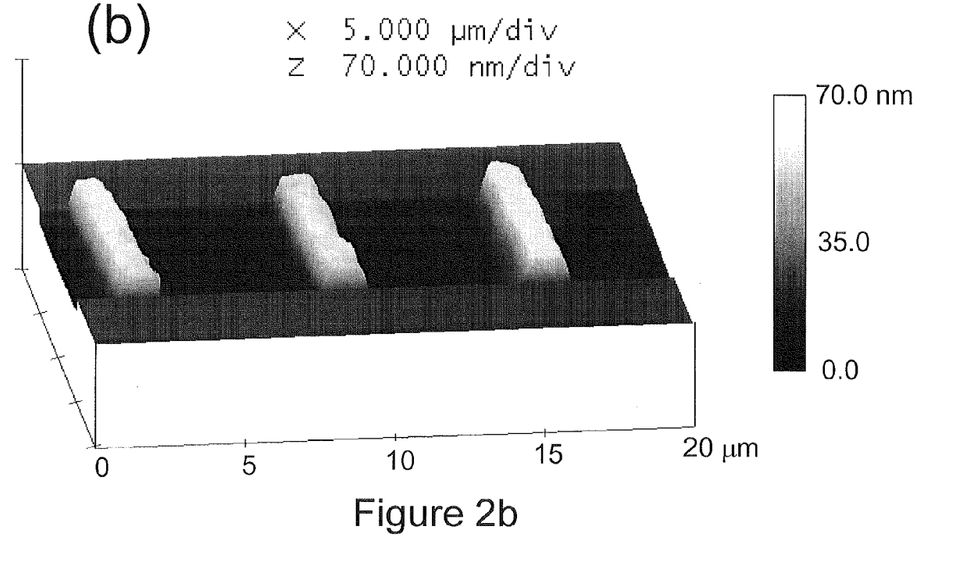

In order to examine the patterning resolution achievable with this technique, photolithography was used to pattern an array of hydrophilic straight lines with line widths of ~2 pm while the surrounding areas were covered with OTS. FIG. 2(a) shows atomic force microscopy images of the patterned PBTTT lines. The PBTTT can be precisely patterned down to 1-2 pm and precisely located in the hydrophilic areas defined by photolithography. This accurate patterning is reproducible over large areas (hundred microns scale). The AFM image (FIG. 2(b)) shows that the surface profile of the patterned lines is rather smooth. No spikes were found at the edges of the patterned PBTTT lines after delamination. Within the accuracy of the AFM measurement the thickness of the PBTTT film in the patterned areas is the same as before delamination (30-40 nm). This patterning technique enables the fabrication of fine features with smooth surfaces and good registration over large areas.

Figure 3:
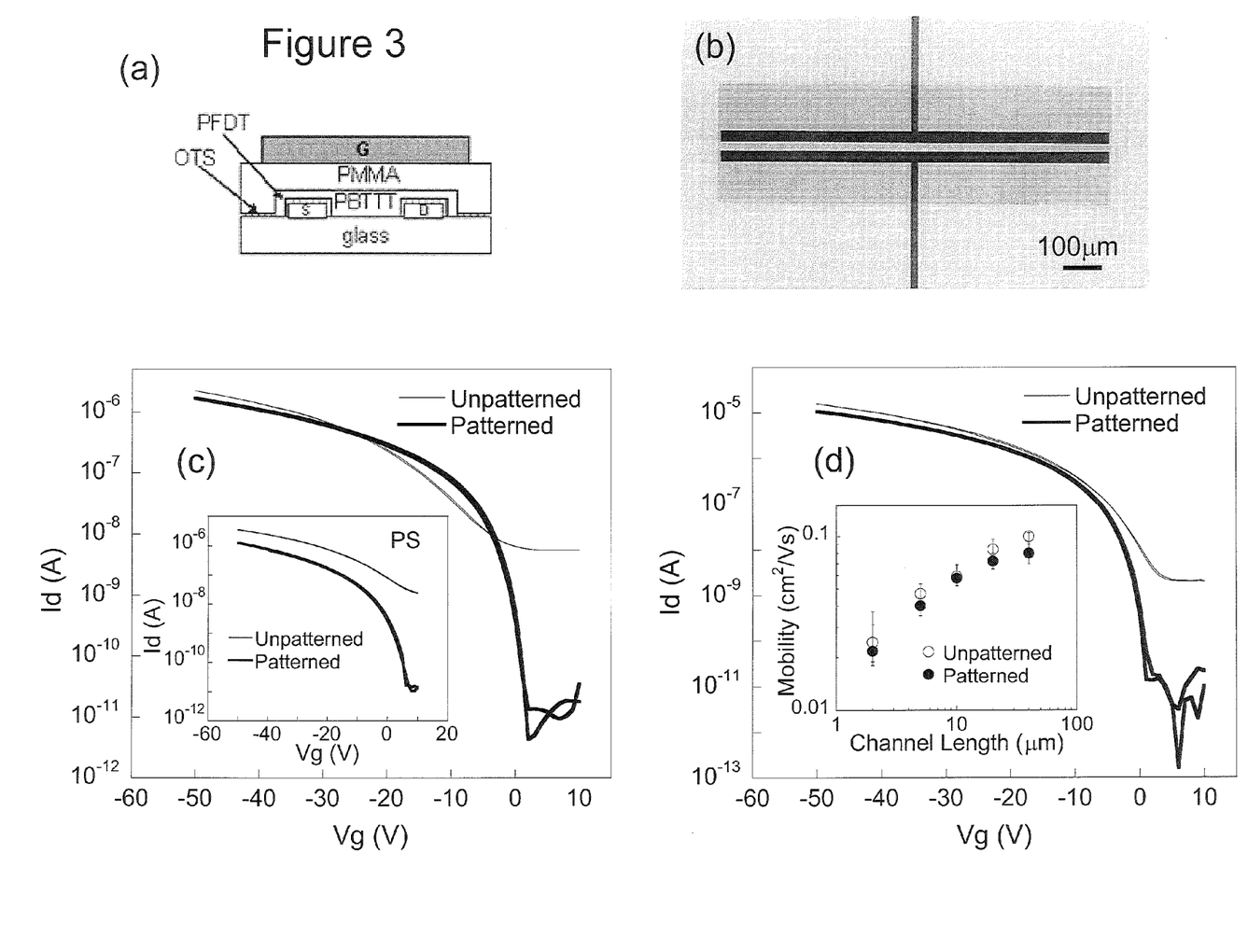

The patterning technique was used to fabricate PBTTT top-gate transistors. The device geometry is shown in the inset of FIG. 3(a). The fabrication process was similar to the one described above. An OTS layer was deposited on a glass substrate with previously patterned Au source-drain electrodes. The OTS layer was then patterned to produce a hydrophilic area covering the channel region and adjacent source/drain contacts but left the rest of the glass substrate hydrophobic. After removing photoresist from the OTS patterning, the substrate was treated with 1H,1H,2H,2Hperfluorodecanethiol (PFDT) to produce hydrophobic surfaces on the bottom-contact Au electrodes. There are two reasons for the PFDT electrode treatment: Firstly, the PFDT reduces the surface energy contrast between the Au electrodes and OTStreated areas so that the electrodes will not attract the semiconducting polymer solution during spin-coating and disrupt the thin film formation. Secondly, the treatment increases the work function of the Au electrodes so as to reduce the contact resistance. After spin-coating PBTTT from 5 mg/ml solution in TCB, PBTTT thin films were dried at 100° C. for 10 min and then annealed into the liquid crystal regime at 170° C. for 10 min, followed by a slow cool to room temperature. A ~500 nm thick PMMA film was spun as the sacrificial layer to delaminate the PBTTT film. The patterned PBTTT film is uniform and completely covers the area patterned without OTS, as the image shown in FIG. 3(b). It was intended to pattern PBTTT into a rectangular shape with two short edges several micrometers away from the edges of the source/drain contacts to minimize the off-channel current in the top-gate device. It can be noticed that the PBTTT film was delaminated from the Au surfaces in the OTStreated areas but not from the Au surfaces in the close area patterned without OTS. It was found that, fortuitously, PBTTT is retained on the PFDT-treated Au electrodes that are surrounded by relatively large-area hydrophilic surfaces. Finally, the top-gate devices were finished by spin-coating a ~500 nm thick PMMA film as the gate dielectric and evaporating a 40 nm thick aluminum top gate electrode. The deposition and delamination of PBTTT and PMMA films were performed in a nitrogen atmosphere to avoid degradation of PBTTT and contamination of the PBTTT/PMMA interface induced by oxygen exposure.

The polymer PBTTT-C14 was synthesized with a number average molecular mass (Mn) of 28,000 g/mol and polydispersity of 2.0. For PBTTT top-gate devices, the bottom-contact Au electrodes were patterned by conventional photolithography with 3-mercaptopropyltrimethoxysilane as an adhesion layer between the Corning 7059 glass substrate and Au electrodes. An octyltrichlorosilane (OTS) layer was deposited by exposing the glass substrates to OTS vapors for 1-2 hours. The OTS layer was then patterned by using positive photoresist (Shipley 1813) as an etch mask and removed with O2 plasma at 150 W for 2 min, After stripping the photoresist, the substrates were treated in 1H,1H,2H2H-perfluorodecanethiol (PFDT) vapor for 24 hours to produce a hydrophobic surface on the Au electrodes. PBTTT thin films of 30-40 nm thickness were spin-coated from 5 mg/ml solution in TCB, dried at 100° C. for 10 min, and then annealed at 170° C. for 10 min, followed by a slow cool to room temperature. The PMMA (Mw=120,000 g/mol) and PS (Mw=200,000 g/mol) solutions were prepared at a concentration of 80 mg/ml and 70 mg/ml in n-butyl acetate, respectively. The PMMA and PS films of ~500 nm for sacrificial and dielectric layers were spin-coated onto the PBTTT films at 2000 rpm for 60 s and dried at 80° C. for 30 min. 3M Scotch tape was used to delaminate the PMMA(PS)/PBTTT films. The transfer characteristics in FIGS. 3(c)(d) show that the patterned PBTTT top gate transistors have a similar on-current and much higher on/off ratios as compared with the un-patterned devices. In general, the off-current of the patterned devices is 2 to 3 orders of magnitude lower than that of un-patterned devices and reaches the gate leakage of the devices (~$10^{-11}$ ampere), suggesting that the patterned PBTTT is effectively gated and the off-channel current is eliminated. Optimal devices with high mobilities close to 0.1 cm2 ws and large on/off ratios of 21 o5 can be achieved in the 40 pm channel length. As scaling the channel lengths down to 2 pm the mobilities of the patterned devices are only slightly (20-30%) lower than that of un-patterned devices (inset of FIG. 3(d)). For a control experiment polystyrene (PS) was used as the sacrificial and dielectric layer (inset of FIG. 3(c)). The patterned device also shows a remarkably improved on/off ratio (lo5) and the mobilities (~0.1 cm2 ws) are of similar order as that of un-patterned device (~0.2 cm2 ws). These results show clearly that the performance of PBTTT top-gate devices is little degraded by the patterning process, and that the high OFF current that is commonly observed in PBTTT top-gate TFTs is not due to an intrinsic leakage current in the channel, but due to parasitic leakage currents in the periphery of the device.

Example 2

Figure 4:
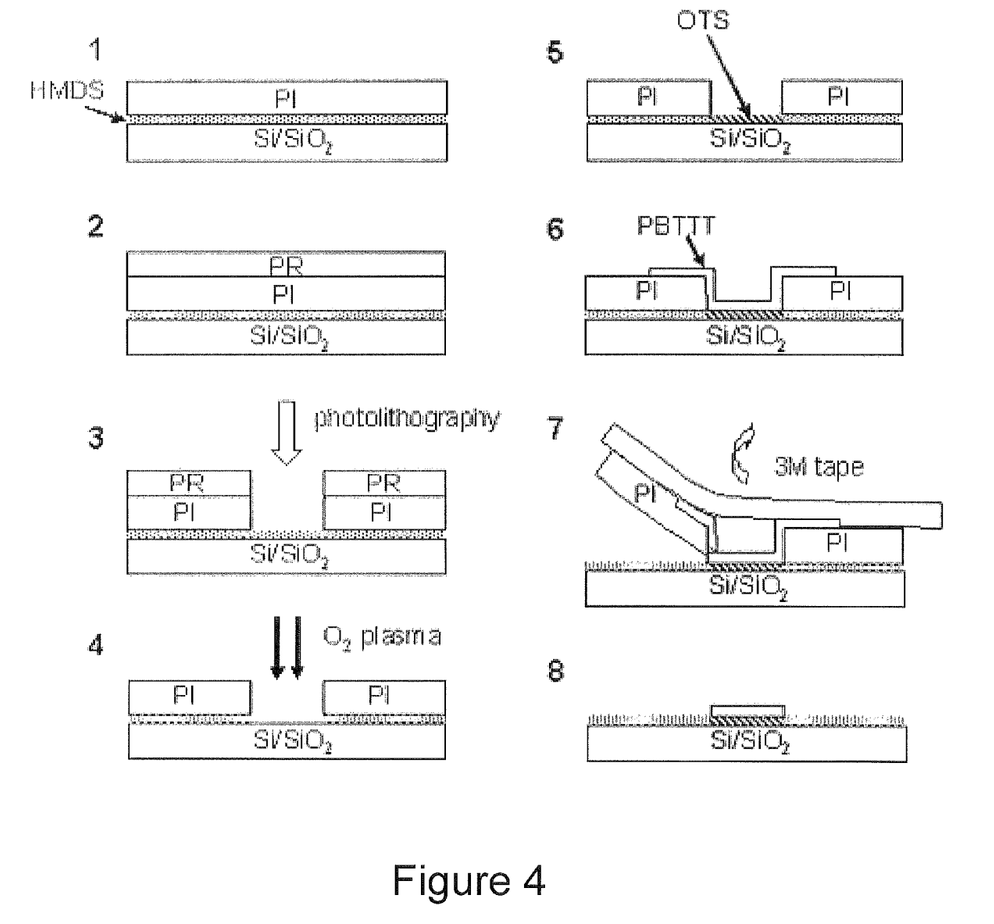
FIG. 4 shows a schematic process flow for lift-off patterning of PBTTT film on OTS-treated surface areas by using 3M Scotch tape to strip off the PBTTT and an underlying patterned polyimide (PI) film from the HMDS-treated surfaces.

In the following a related embodiment that allows semi conducting polymers to be patterned on hydrophobic surfaces is presented. This method utilizes a patterned solid film as a sacrificial layer to peel off the semi conducting polymer film from the undesired areas on the substrate. Polyimide is chosen as the sacrificial layer because (i) it is sufficiently mechanically robust after being annealed, (ii) it can easily be patterned, and (iii) it can easily be delaminated from hydrophobic surfaces. The whole process is described in FIG. 4. An HMDS monolayer was deposited on a Si/SiO2 substrate and then a polyimide film was spun with a thickness of ~1 pm. The polyimide film was dried at 100° C. for 10 min and then annealed at 270° C. for 15-20 min. The resulting polyimide film can be dissolved in Shipley MF319 developer used in photolithography but not in the organic solvents used for the successive PBTTT deposition. After patterning the polyimide film, the HMDS monolayer was removed in the patterned areas by O2 plasma etching and then deposited an OTS layer instead.

Figure 5A:
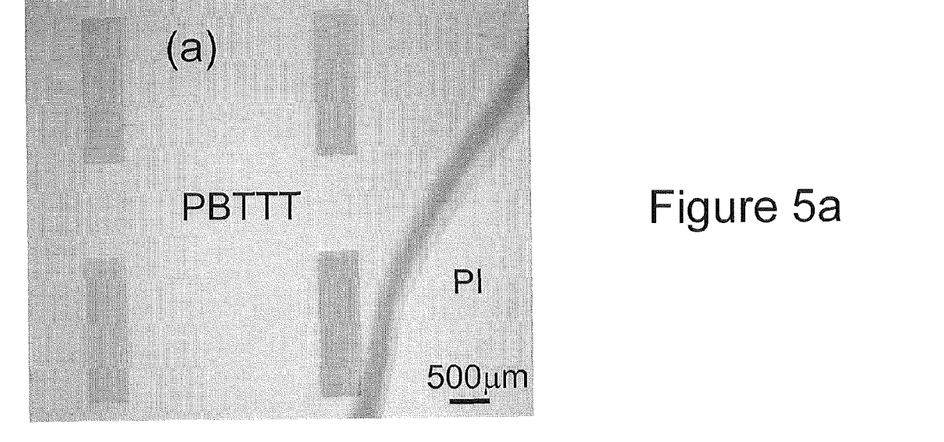

The PBTTT film was spin-coated from an 8 mg/ml solution in 1,2 dichlorobenzene (DCB) to cover the OTS-treated/patterned areas as shown in FIG. 5(a). Finally a 3M Scotch tape was used to strip off the polyimide/PBTTT films from the HMDS-treated surfaces. Since the PBTTT film is significantly thinner than the PI film, a patterned PBTTT film is left behind on the OTS-treated surface areas.

Figures 5B, 5C:
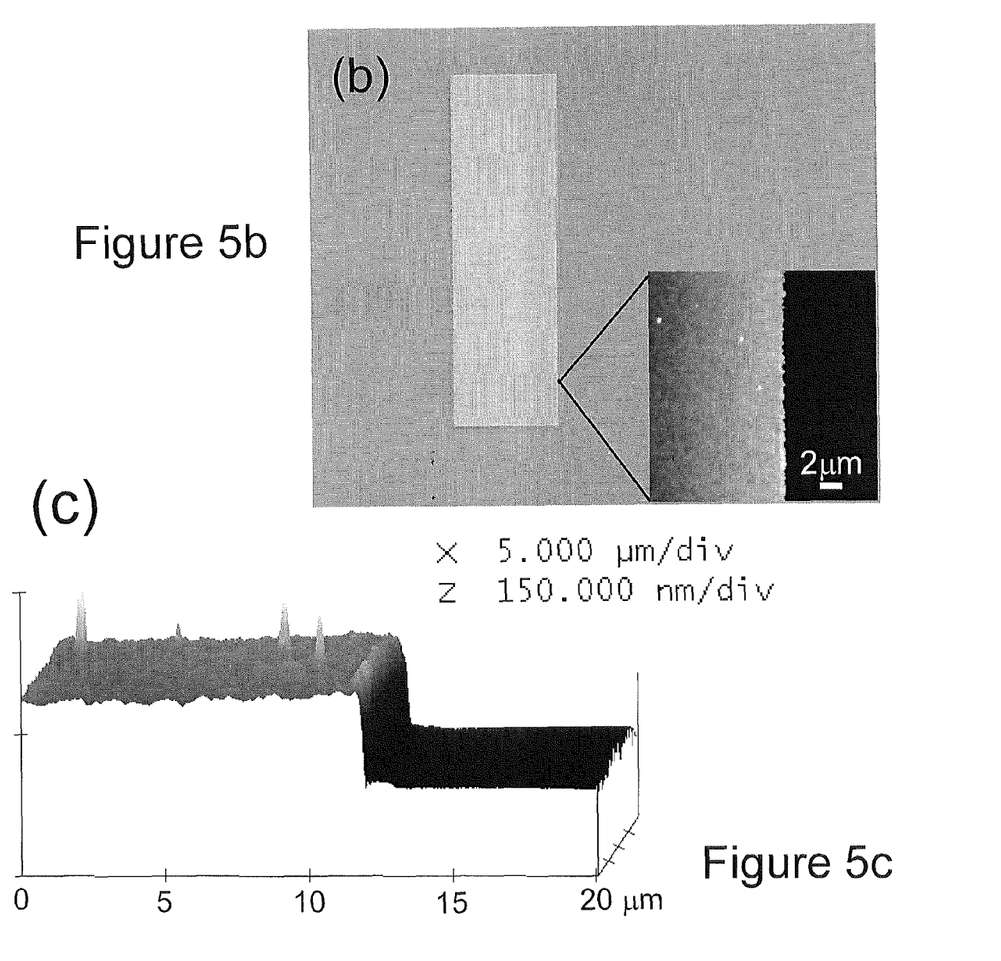

FIG. 5(b) shows an optical microscopy image of a PBTTT film patterned into a rectangular shape after peeling off the polyimide film in FIG. 5(a). The patterned PBTTT film is well defined and has sharp edges with a lateral roughness in a submicron scale. The AFM image in FIG. 5(c) further shows that the surface roughness at the edge of the patterned PBTTT is around several tens of nanometers, much smaller than the thickness of the stripped polyimide film. This indicates that the physical peel-off process breaks neatly the continuous PBTTT film near the lower edges of the patterned polyimide film which could be due to a strong adhesion of PBTTT with the polyimide layer, The resolution of this patterning method can be down to hundreds or even several tens of microns.

Figure 6:
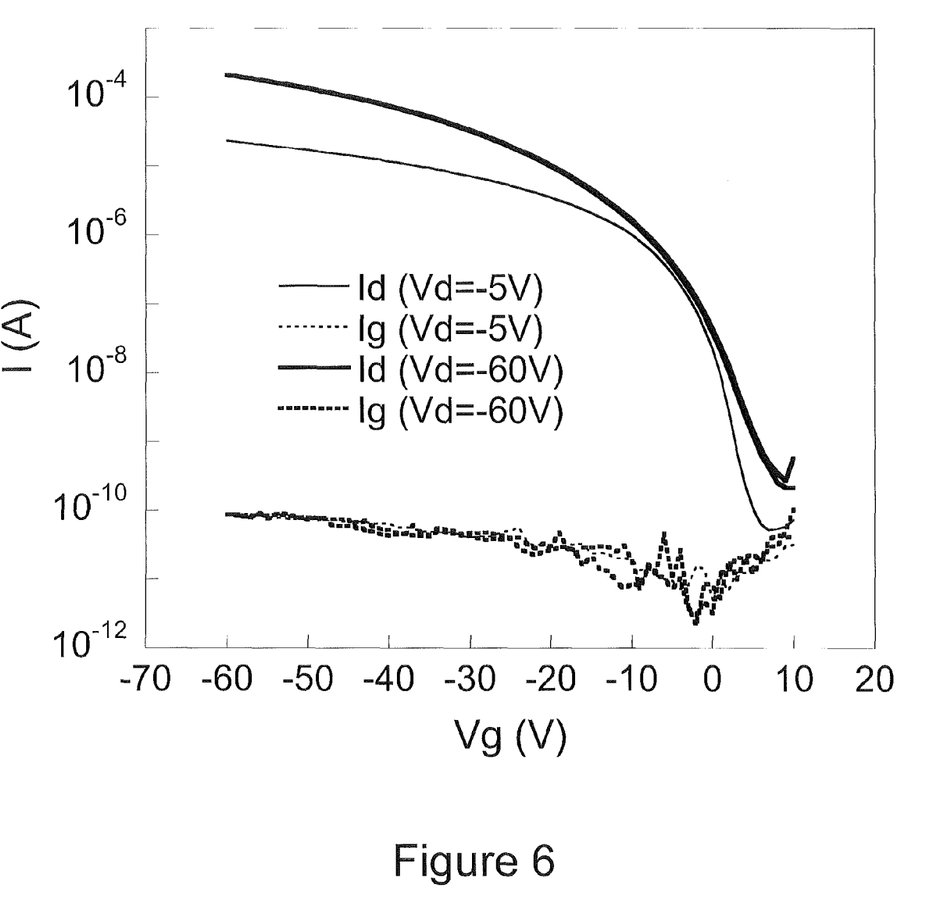
FIG. 6 shows transfer characteristics of patterned PBTTT bottom-gate, top contact device on Si/SiO2 substrate. The channel length and width are 20 pm and 1000 pm, respectively.

Bottom-gate, top-contact transistors were fabricated with such patterned PBTTT films on OTS-treated Si/Si02 substrates. Prior to evaporating the top-contact Au electrodes the patterned PBTTT film was annealed into its liquid crystalline phase at 170° C. for 10 min. The patterned device shows excellent transfer characteristics with a 35 sharp turn-on behavior, a large on/off ratio, and low gate leakage (FIG. 6). The extracted mobilities (plin-0.18 cm2/Vs and p,,,-0.25 cm2/Vs) are comparable to literature data for un-patterned PBTTT, and no degradation was found compared to un-patterned reference devices fabricated under otherwise identical process conditions.

For the second embodiment to pattern PBTTT on OTS-treated surfaces, the HMDS monolayer was deposited on a Si/Si02 substrate by spin-coating HMDS at 1000 rpm for 60 sec and then baked at 100° C. for 5 min. The polyimide was diluted in 1-methyl-2-pyrrilidinone (NMP) with a ratio of 2:1 and spin-coated at 5000 rpm for 3 min to achieve the thickness of -1 pm. The polyimide film was dried at 100° C. for 10 min and then annealed at 270° C. for 15-20 min in ambient atmosphere. Prior to photolithography the polyimide surface was treated with $O_2$ plasma at 250 W for 1 min to prevent photoresist from dewetting. After patterning the polyimide film and depositing an OTS layer into the exposed areas of the glass substrate, the PBTTT film was spin coated from an 8 mg/ml solution in DCB to cover the OTS-treated areas and peeled off the polyimide/PBTTT films from the HMDS-treated surfaces, and then annealed the patterned PBTTT films at 170° C. for 10 min. The PBTTT solution deposition, peel-off and annealing processes were all performed in nitrogen atmosphere. 30 nm thick Au source-drain electrodes were evaporated onto the patterned PBTTT film with channel length of 20 μm and channel width of 1000 μm. The thickness of the thermally grown $SiO_2$ gate dielectric in the bottom-gate device is 300 nm.

The methods hereinbefore described achieve precise patterning of high mobility, semicrystalline semiconducting polymers on hydrophilic and hydrophobic substrates. The methods employ physical delamination processes instead of chemical patterning or etching processes and can easily be integrated into the device fabrication process without degradation of device performance. Patterning of the polymer semiconductor leads to a significant reduction in OFF current in both top-gate and bottom-gate device configurations, while retaining the high field-effect mobilities of the un-patterned polymer films. The method provides high-resolution but low-cost patterning of high-performance polymer semiconducting films for a range of practical applications, including displays, logic circuits, sensors. The method is applicable to patterning of organic semiconductors for applications other than transistors, such as, but not limited to, light-emitting diodes, photovoltaics diodes, photodetectors, sensor and memory devices.

In conclusion, the invention provides novel systems, devices, methods and arrangements for patterning an electronic of photonic material. While detailed descriptions of one or more embodiments of the invention have been given above, a wide range of modifications and alterations may be made to the arrangement described hereinbefore without departing from the scope of the invention. Therefore, the above description should not be taken as limiting the scope of the invention, which is defined by the appended claims.

What is claimed is:

1. A method of patterning an electronic or photonic material on a substrate comprising:
   treating the surface of the substrate by depositing a surface energy modification layer and patterning said surface energy modification layer to provide said surface with a pattern defining where said electronic or photonic material is to be present;
   forming a film of said electronic or photonic material on said substrate;
   wherein said film of electronic or photonic material fills said pattern, overlaps the edges of said pattern and has regions extending beyond said edges of said pattern; and
   using an adhesive to selectively remove regions of said electronic or photonic material from said film,
   thereby leaving on said substrate said patterned electronic or photonic material and said surface energy modification layer.

2. A method as claimed in claim 1, wherein said film of electronic or photonic material is continuous.

3. A method as claimed in claim 2, wherein said pattern comprises areas of higher and lower surface energy or, after said deposition of said electronic or photonic material, of higher and lower interfacial toughness.

4. A method as claimed in claim 1, wherein said pattern comprises areas of higher and lower surface energy or, after said deposition of said electronic or photonic material, of higher and lower interfacial toughness.

5. A method as claimed in claim 1, further comprising a step of depositing a sacrificial layer on said electronic or photonic material.

6. A method as claimed in claim 5, wherein said adhesive is brought into contact with said sacrificial layer.

7. A method as claimed in claim 1 comprising:
   providing a patterned substrate having areas of higher and lower surface energies and having deposited thereon (i) a continuous film of electronic or photonic material and (ii) a sacrificial layer;
   bringing an adhesive into contact with said sacrificial layer; and
   peeling off said adhesive to selectively remove regions of said electronic or photonic material from said film.

8. A method as claimed in claim 1, comprising:
   treating the surface of said substrate to define areas having higher and lower surface energies;
   forming a film of said electronic or photonic material on said substrate;
   depositing a sacrificial layer on said film;
   bringing an adhesive into contact with said sacrificial layer; and
   peeling off said adhesive to selectively remove regions of said electronic or photonic material from said film.

9. A method as claimed in claim 1, wherein said pattern comprises a topographical profile comprising protrusions and recesses.

10. A method as claimed in claim 1 or claim 9, wherein treating of said surface of said substrate comprises depositing a sacrificial layer on said surface energy modification layer deposited on said substrate and treating said sacrificial layer to define a topographical profile comprising protrusions and recesses.

11. A method as claimed in claim 10, wherein said film of electronic or photonic material is formed on said sacrificial layer.

12. A method as claimed in claim 9, wherein said adhesive is brought into contact with the protrusions.

13. A method as claimed in claim 9 comprising:
providing a substrate having deposited thereon (i) a sacrificial layer in the form of a topographical profile comprising protrusions and recesses and (ii) a film of electronic or photonic material;
bringing an adhesive into contact with said protrusions; and
peeling off said adhesive to selectively remove regions of electronic or photonic material from said film.

14. A method as claimed in claim 13, comprising:
depositing on the surface of the surface energy modification layer of a substrate a sacrificial layer and treating said layer to define a topographical profile comprising protrusions and recesses;
forming a film of said electronic or photonic material on said profile;
bringing an adhesive into contact with said protrusions; and
peeling off said adhesive to selectively remove regions of said electronic or photonic material from said film.

15. A method as claimed in claim 1, wherein said electronic or photonic material is a conducting polymer, a polymer dielectric or a nanoparticulate material.

16. A method as claimed in claim 1, wherein said electronic or photonic material is an organic semi conductor.

17. A method as claimed in claim 16, wherein said electronic or photonic material is a conjugated non-polymeric semi conductor.

18. A method as claimed in claim 16, wherein said electronic or photonic material is a conjugated polymeric semiconductor.

19. A method as claimed in claim 1, wherein said adhesive is on a carrier.

20. A method as claimed in claim 1, wherein said film of electronic or photonic material is formed by solution deposition.

21. A method of making an electronic or photonic device on a substrate comprising:
treating the surface of the substrate by depositing a surface energy modification layer and patterning said surface energy modification layer to provide said surface with a pattern defining where said electronic or photonic material is to be present;
forming a film of said electronic or photonic material on said substrate;
wherein said film of electronic or photonic material fills said pattern, overlaps the edges of said pattern and has regions extending beyond said edges of said pattern; and
using an adhesive to selectively remove regions of said electronic or photonic material from said film,
thereby leaving on said substrate said patterned electronic or photonic material and said surface energy modification layer; and
using said substrate bearing said pattern in the manufacture of a device.

22. A method of fabricating an electronic or photonic device on a substrate
using solution or vacuum deposition of an electronic or photonic material, the method comprising:
providing said substrate;
treating a surface of said substrate to provide said substrate with a pattern defining where said electronic or photonic material is to be present on said fabricated device;
depositing said electronic or photonic material from solution or vacuum over said pattern on said substrate such that the deposited material overlaps the edges of said pattern and has regions extending beyond said edges of said pattern;
applying a carrier bearing an adhesive over said deposited electronic or photonic material on said substrate;
removing said adhesive bearing carrier together with said regions of said deposited material extending beyond said edges of said pattern to leave said deposited material in situ in said pattern; and
using said substrate bearing said pattern of deposited material to fabricate said electronic or photonic device.

23. A method as claimed in claim 22, wherein said electronic or photonic device comprises an electronic device, wherein said electronic or photonic material comprises a semi-conducting material, and wherein said substrate includes one or more electrodes optimally provided with an energy level matching material to match an energy level of said electrode to an energy level of said semi-conducting material.

* * * * *